United States Patent [19]

Doussiere et al.

[11] Patent Number: 5,717,711
[45] Date of Patent: Feb. 10, 1998

[54] LASER DEVICE, NOTABLY FOR OPTICAL PUMPING, AND METHOD OF FABRICATING IT

[75] Inventors: Pierre Doussiere, Saint Germain les Arpajons; Isabelle Riant, Palaiseau, both of France

[73] Assignee: Alcatel Optronics, Paris, France

[21] Appl. No.: 753,093

[22] Filed: Nov. 20, 1996

[30] Foreign Application Priority Data

Nov. 21, 1995 [FR] France .................. 95 13814

[51] Int. Cl.⁶ .................. H01S 3/08; G02B 6/30; H01L 21/20
[52] U.S. Cl. .................. 372/102; 372/7; 372/19; 372/43; 372/92; 372/98; 385/49; 385/37; 385/88; 437/129
[58] Field of Search .................. 372/6, 7, 19, 29, 372/43, 50, 69, 70, 72, 92, 98, 99, 102, 96; 385/49, 37, 88, 92; 437/129

[56] References Cited

U.S. PATENT DOCUMENTS

| 5,305,335 | 4/1994 | Ball et al. ............... | 372/6 |
| 5,323,404 | 6/1994 | Grubb ............... | 372/6 |
| 5,337,382 | 8/1994 | Mizrahi ............... | 385/37 |
| 5,422,897 | 6/1995 | Wyatt et al. ............... | 372/6 |
| 5,561,675 | 10/1996 | Bayon et al. ............... | 372/6 |
| 5,589,684 | 12/1996 | Ventrudo et al. ............... | 372/102 X |
| 5,594,747 | 1/1997 | Ball ............... | 372/31 |
| 5,602,864 | 2/1997 | Welch et al. ............... | 372/50 |
| 5,651,018 | 7/1997 | Mehuys et al. ............... | 372/50 |
| 5,659,644 | 8/1997 | Digiovanni et al. ............... | 385/31 |

FOREIGN PATENT DOCUMENTS

| 0332723A1 | 9/1989 | European Pat. Off. ............ | 372/43 X |
| 0553994A1 | 8/1993 | European Pat. Off. ............ | 372/43 X |
| 3195076 | 8/1991 | Japan .................. | 372/102 X |

OTHER PUBLICATIONS

R. P. Bryan et al., "Nonplanar quantum well heterostructure window laser", *Applied Physics Letters*, vol. 54, No. 17, Apr. 24, 1989, pp. 1634–1636.

M. Sagawa et al., "High power COD–free operation of 0.9μm InGaAs/GaAs/InGaP Lasers with non–injection regions near the facets", *Electronics Letters*, vol. 30, No. 17, Aug. 18, 1994, pp. 1410–1411.

P. A. Mortoon et al., "Packaged hybrid soliton pulse source results and 270Terabit.km/sec soliton transmission", *IEEE Photonics Technology Letters*, vol. 7, No. 1, 1 Jan. 1995, pp. 111–113.

C. R. Giles et al., "Simultaneous wavelength–stabilization of 980–nm pump lasers", *IEEE Photonics Technology Letters*, vol. 6, No. 8, Aug. 5, 1994, pp. 907–909.

*Primary Examiner*—Brian Healy
*Attorney, Agent, or Firm*—Sughrue, Mion, Zinn, Macpeak & Seas, PLLC

[57] ABSTRACT

In a laser device, notably for optical pumping, the wafer includes an expansion segment adjacent the exit to prevent degradation of the exit facet of the semiconductor wafer that constitutes the amplifying part of the laser. The other facet is reflective and a Bragg grating is formed in a coupling fiber disposed near the exit facet. Applications include optical pumping of erbium-doped fiber amplifiers.

10 Claims, 1 Drawing Sheet

LASER DEVICE, NOTABLY FOR OPTICAL PUMPING, AND METHOD OF FABRICATING IT

BACKGROUND OF THE INVENTION

1. Field of the Invention

The invention is in the field of laser devices in which optical amplification is effected by a semiconductor wafer. It is more particularly concerned with semiconductor lasers having a high optical output power. This applies in particular to the lasers used for optical pumping of erbium-doped fiber amplifiers.

2. Description of the Prior Art

This application requires lasers producing a high optical power output at a wavelength of 0.98 µm. Semiconductor lasers fabricated on gallium arsenide substrates that are capable of producing this wavelength are usually employed. These lasers essentially comprise an optical amplifier formed on the substrate, two opposite ends of which are cleaved to form a resonant cavity. The laser wave is produced in an active layer of the amplifying part. This layer has a generally rectangular cross-section 2 µm to 4 µm wide and 0.1 µm to 0.2 µm thick. As a result the light wave passing through the exit facet of the laser has a high energy density. Also, deterioration or even destruction of this facet occurs above a particular power level.

One solution to this problem that has previously been used is to cleave the facets in a very hard vacuum and to treat the exit facet by deposition of oxide, also in a very hard vacuum. The oxide layer passivates the facet which makes it more resistant to high energy densities. This technique is complex, however, since it requires expensive equipment (to produce the very hard vacuum) and is not suited to mass production.

The invention proposes another approach which is directed to reducing the energy density passing through the facet rather than making the latter more resistant.

Consideration might be given to modifying the conventional structure of a semiconductor laser by providing at one end an expansion segment allowing the light from the active layer to be diffracted before encountering the exit facet. This solution is unsatisfactory, however, since it introduces intracavity losses that reduce the effective reflection coefficient of the exit facet and reduce the laser yield. Also, to maintain the operation of the laser, the length of the expansion segment must be limited, which rules out significant reduction of the energy density.

SUMMARY OF THE INVENTION

With the aim of solving this problem, the invention consists in a laser device comprising:
- an amplifier segment comprising an active layer formed in a semiconductor wafer delimited by first and second facets, and
- first and second mirrors disposed in such manner as to form a resonant cavity, said first mirror being external to said wafer, wherein a coupling fiber has one end disposed near said first facet, said first mirror is formed in said coupling fiber and said wafer includes an expansion segment adjacent said first facet to enable transverse expansion of light emitted by said active layer before it passes through said first facet.

The fact that the first mirror is formed in the coupling fiber enables anti-reflection treatment of the exit facet, which eliminates the intracavity reflections and the mode jumps that can result from them.

The above structure can be used for any type of substrate but is of particular benefit in the case of gallium arsenide which has a particular sensitivity to high energy densities. In this case, the length of the expansion segment is advantageously between 10 µm and 50 µm to enable significant expansion of the light wave (by a factor in the order of 3).

The efficiency of the laser device of the invention may be considerably improved by paying particular attention to the coupling between the fiber and the exit facet. To this end, in accordance with one particular aspect of the invention, the end of the fiber is terminated in the form of a diopter dimensioned for maximum optimum coupling with the facet.

In accordance with another aspect, the fiber is a photosensitive fiber and the mirror is a Bragg grating written in the fiber by optical means. This solution has the advantage that it enables a first order grating to be produced in all cases. A grating of this kind cannot always be obtained in an integrated fashion, especially in the case of gallium arsenide.

The length of the grating written by optical means is advantageously between 1 mm and 5 mm. In one preferred embodiment the semiconductor wafer and the end of the fiber are contained in a package through one wall of which the fiber passes and by which wall the fiber is held. This "packaged" implementation protects the fiber part containing the grating from any external mechanical stresses that would otherwise modify the specifications of the grating.

Turning to the fabrication of the device and in particular of the expansion segment, one solution could be to etch one end of the wafer after the formation of these constituent layers, and then to grow substrate over this area. This solution, which requires further epitaxial growth, may cause problems because the surface state of the etched planes may degrade the optical properties of the device. This problem is particularly difficult to solve in the case of a gallium arsenide substrate.

To solve this problem, there is also proposed a method of fabricating a semiconductor wafer to form the expansion segment. The invention therefore also consists in a fabrication method including:
- a first step of growing a n-doped alloy layer on a semiconductor substrate,
- a second step of growing an active layer on said n-doped layer,
- a third step of growing a p-doped alloy layer on said active layer, and
- cleaving operations to form first and second facets delimiting said wafer, wherein said first growth step is preceded by a step of etching said substrate over the whole of the surface of said substrate except for an area near one of said facets so as to form in said substrate an expansion segment enabling transverse expansion of light emitted by said active layer.

As a consequence of using the above method the active layer extends the whole length of the wafer, and is all in one plane except for its part in the expansion segment.

Other aspects and advantages of the invention will emerge from the remainder of the description given with reference to the figures.

DETAILED DESCRIPTION OF THE PREFERRED EMBODIMENT

Figure 1:
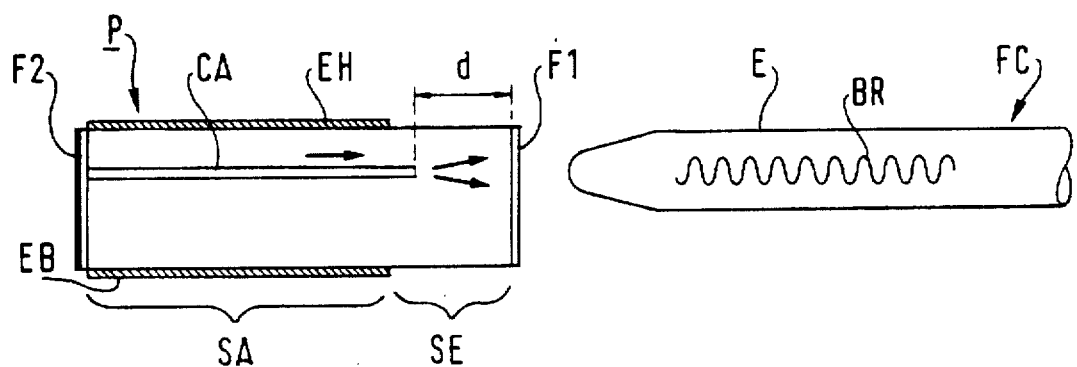
FIG. 1 is a diagrammatic representation of a laser device of the invention.

The laser device is shown diagrammatically in FIG. 1. It comprises a semiconductor wafer P and a coupling fiber FC of which only the end portion E is shown. The wafer P includes an amplification segment SA containing an active layer CA through which an electrical current can be passed by means of a top electrode EH and a bottom electrode EB. The wafer is delimited in the longitudinal direction by two cleaved facets F1, F2. The facet F2 is reflective and may receive a dielectric treatment to increase its reflectivity and to force laser emission via the front facet. The facet F1 has an anti-reflection coating. One of the guide ends of the active layer CA is separated from the transparent facet F1 by an expansion segment SE formed in one end of the wafer P. The tip of the fiber FC is located near the facet F1, at a distance enabling optimal optical coupling with the wafer. The end portion E includes a Bragg grating BR. If the fiber is photosensitive, the grating BR can be written by optical means using a known method. The pitch of the grating BR is chosen for first order agreement with the wavelength chosen for the device. Thus, in the case of a gallium arsenide substrate, the wavelength is 0.98 µm, which for a fiber having an effective index around 1.5 requires a pitch of 0.35 µm.

The end portion E of the fiber advantageously terminates in a diopter having a shape chosen to optimize coupling. In this way a coupling coefficient in the order of 0.5 can be obtained. The reflection coefficient of the Bragg grating BR can then be in the order of 0.10, the reflection coefficient of the facet F1 being negligible.

Figure 2:
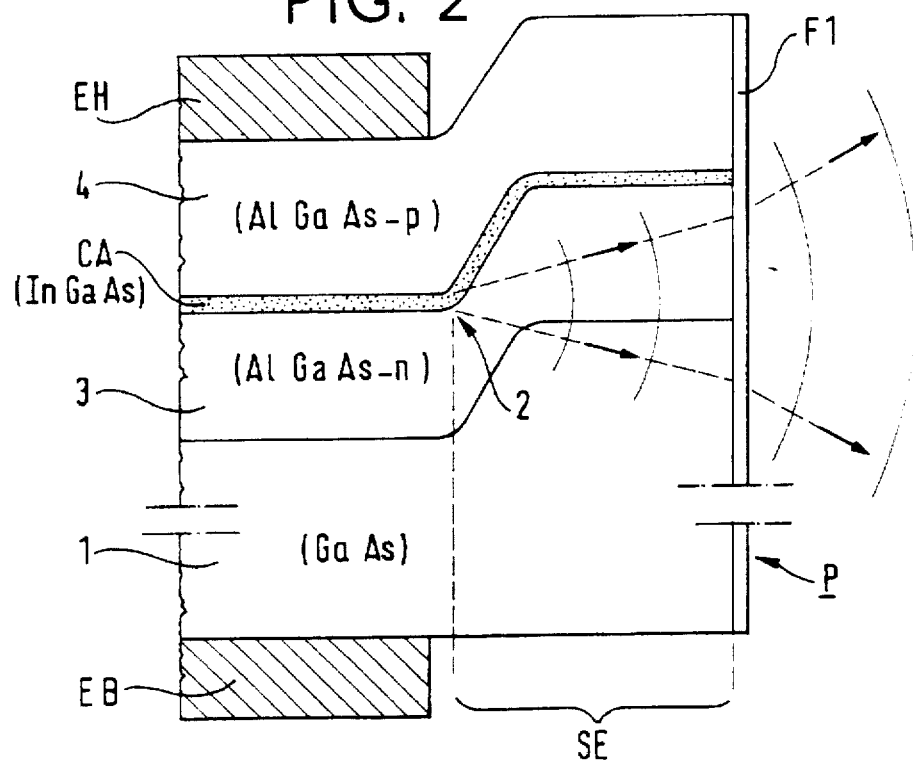
FIG. 2 shows a detail of the semiconductor wafer obtained by the method of the invention.

FIG. 2 shows in more detail the structure of the water 1 in the vicinity of the expansion segment SE when the method of the invention is used.

In this example, the wafer is fabricated from the gallium arsenide substrate 1 which is etched over virtually all of its surface except for the area that is to become the expansion segment SE. n-doped AlGaAs quaternary alloy is then grown on the substrate. The InGaAs or InGaAsP alloy active layer CA is then formed. The p-doped AlGaAs alloy layer 4 is finally formed.

The localized etching of the substrate 1 is such that the active layer CA is highly curved (2) in the vertical plane, which eliminates its optical guide property starting from this curvature.

The expansion segment SE is then equivalent to a diffraction area enabling spreading of the wave from the active layer. This solution has the advantage of avoiding the surface state problem arising from etching the AlGaAs layers.

Figure 3:
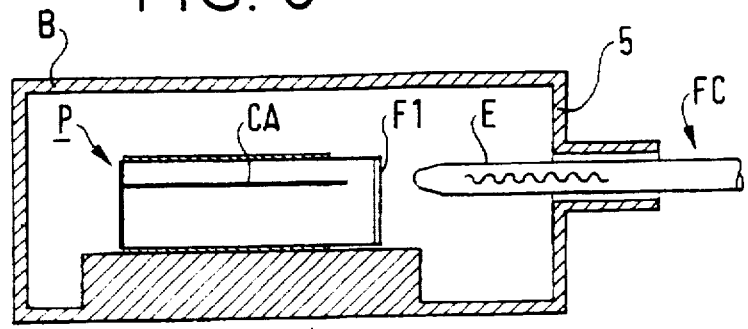
FIG. 3 is a diagrammatic representation of a "packaged" implementation of the laser device of the invention.

FIG. 3 shows a packaged implementation of the device of the invention. The wafer P is fixed to the interior of a casing B. The fiber FC passes through the wall 5 of the casing so that the end portion E is inside the casing and located in front of the facet F1 at the height of the active layer CA. As shown diagrammatically, the wall 5 is adapted to hold the end of the fiber accurately relative to the casing.

Of course, the figures that have just been described are merely diagrammatic representations which, for reasons of clarity, do not represent the actual proportions of a real device. For a GaAs laser device tuned to a wavelength of 0.98 µm, the orders of magnitude of the dimensions may be as follows:

Length of active layer: 600 µm–1 mm

Width of active layer: 2 µm–4 µm

Thickness of active layer: 0.1 µm–0.2 µm

Length d of expansion segment: 10 µm–50 µm

Facet F1 to fiber end distance: 5 µm–30 µm

Length of Bragg grating BR: 1 mm–5 mm

Effective index of fiber: 1.5 approx.

Pitch of Bragg grating: 0.35 µm approx.

There is claimed:

1. A laser device comprising:

an amplifier segment comprising an active layer formed in a semiconductor wafer delimited by first and second facets, and first and second mirrors disposed in such manner as to form a resonant cavity, said first mirror being external to said wafer, wherein a coupling fiber has one end disposed near said first facet, said first mirror is formed in said coupling fiber and said wafer includes an expansion segment adjacent said first facet to enable transverse expansion of light emitted by said active layer before it passes through said first facet.

2. The laser device claimed in claim 1 wherein said active layer extends the whole length of said wafer and lies in one plane except for its part that is in said expansion segment.

3. The laser device claimed in claim 1 wherein said wafer is formed from a gallium arsenide substrate.

4. The laser device claimed in claim 3 wherein said expansion segment has a length between 10 µm and 50 µm.

5. The laser device claimed in claim 1 wherein said end portion of said fiber terminates in the form of a diopter dimensioned for maximum optical coupling with said wafer.

6. The laser device claimed in claim 1 wherein said fiber is a photosensitive fiber and said first mirror is a Bragg grating written by optical means in the end portion of said fiber.

7. The laser device claimed in claim 6 wherein said Bragg grating is between 1 mm and 5 mm long.

8. The laser device claimed in claim 1 wherein said wafer and an end portion of said fiber are contained in a casing through a wall of which said fiber passes and by which wall said fiber is held.

9. Use of a laser device as claimed in claim 1 for optical pumping of erbium-doped fibers.

10. Method of fabricating a semiconductor wafer for implementing a laser device as claimed in claim 1, including:

a first step of growing a n-doped alloy layer on a semiconductor substrate, a second step of growing an active layer on said n-doped layer, a third step of growing a p-doped alloy layer on said active layer, and cleaving operations to form first and second facets delimiting said wafer, wherein said first growth step is preceded by a step of etching said substrate over the whole of the surface of said substrate except for an area near one of said facets so as to form in said substrate an expansion segment enabling transverse expansion of light emitted by said active layer.

* * * * *